United States Patent [19]
Lee

[11] Patent Number: 5,808,426
[45] Date of Patent: Sep. 15, 1998

[54] HORIZONTAL DRIVE CIRCUIT FOR LARGE CURRENT IN VIDEO DISPLAY

[76] Inventor: Seung-Taek Lee, 207-201, Wooman Apt., Wooman-dong, Paldal-gu, Suwon-si, Kyungki-do, Rep. of Korea

[21] Appl. No.: 768,716

[22] Filed: Dec. 18, 1996

[30] Foreign Application Priority Data

Dec. 18, 1995 [KR] Rep. of Korea .................. 51334/1995

[51] Int. Cl.⁶ ............................. G09G 1/04; H01J 29/70
[52] U.S. Cl. ........................................................ 315/408
[58] Field of Search ..................................... 315/408, 411

[56] References Cited

U.S. PATENT DOCUMENTS 2,868,537  2/1959  Haferl .
3,906,305  9/1975  Nillesen .
4,177,393  12/1979  Förster .................................... 315/408
4,258,630  3/1981  Graffenberger et al. .
4,263,615  4/1981  Steinmetz et al. .
4,712,047  12/1987  Weindorf .
5,438,245  8/1995  Kii et al. .
5,614,794  3/1997  Yu ........................................... 315/411

Primary Examiner—Gregory C. Issing
Attorney, Agent, or Firm—Robert E. Bushnell, Esq.

[57] ABSTRACT

A high current horizontal drive circuit for a video display, includes: a horizontal drive for amplifying the pulses generated by a horizontal oscillator; a drive voltage adjustment circuit for adjusting a drive voltage, and a horizontal deflection output circuit, for generating a horizontal deflection current according to the adjusted drive voltage.

10 Claims, 3 Drawing Sheets

3

HORIZONTAL DRIVE CIRCUIT FOR LARGE CURRENT IN VIDEO DISPLAY

CLAIM OF PRIORITY

This application makes claims all benefits accruing under 35 U.S.C. §119 from an application for HORIZONTAL DRIVE CIRCUIT FOR LARGE CURRENT IN VIDEO DISPLAY earlier filed in the Korean Industrial Property Office on 18 Dec. 1995 and there duly assigned Ser. No. 51334/1995.

BACKGROUND OF THE INVENTION

1. Field of the Invention

The present invention relates to a high current horizontal drive circuit for a video display, and more particularly to a high current horizontal drive circuit, which includes a means for adjusting the base current of a horizontal output transistor according to an input deflection frequency.

2. Description of the Related Art

Generally, the horizontal drive circuit modifies the signal waveform. and supplies sufficient base current to turn on the output transistor. The drive circuit may be of two types, which are respectively named the same phase (same polarity) drive type and the opposite phase (opposite polarity) drive type according to the operational manner that the output terminal is turned on or off with the drive terminal on.

The voltage for driving the output terminal of the video display circuit may be a pulse, and it is possible to directly drive provided the output of the horizontal oscillator is sufficiently large. However, by directly connecting to the output of all oscillator circuit, the output terminal of the video display circuit may cause the oscillation frequency to be unstable. Hence, a buffer amplifier is often used for the horizontal drive circuit.

The image resolution of the video display is determined by the bandwidths of the horizontal and vertical frequencies, and therefore, the horizontal deflector for deflecting the horizontal frequency is especially important when designing a high resolution video display. Particularly, the transistor used as the horizontal output should be operated within a safe operation limit, considering the condition of the base drive. the current and voltage of the collector, switching, etc. Meanwhile, as the resolution of the monitor is enhanced, the horizontal drive circuit requires a large current and high voltage together with a short risetime and falltime.

More specifically, describing an earlier horizontal drive circuit with reference to FIG. 1. the output of the horizontal oscillator 10 is amplified by 2 field effect transistor (FET) Q1 whose output is supplied through the horizontal output transformer "T" to the base of the horizontal output transistor Q2.

The collector voltage and current of the horizontal output transistor Q2 are supplied to the horizontal deflector yoke HDY forming the scanning lines on the screen.

In addition, if one requires an horizontal output circuit of an ultra high resolution (for example, 20 A and 2000 V) for a display used in medical equipment, the elemental devices are required to have a large current and high voltage capacity, and a high speed switching capacity. Hence, the specification of the horizontal output transistor Q2 must be enhanced, which is practically impossible because it has the maximum limit of 15 A and 1500 V. Furthermore, it is difficult to supply a large current to the base of the transistor Q2, which has an additional drawback of slow switching unsuitable for a circuit requiring a high speed rising and falling.

Therefore, the conventional bipolar transistor must be fully saturated when turning on the horizontal output transistor while the storage time must be minimized when turning off the horizontal output transistor, which makes it very difficult to design the horizontal drive circuit. Moreover, in order to design a display to control various modes of resolution, a simple combination of transistors and transformer can not provide for a reliable horizontal drive circuit.

SUMMARY OF THE INVENTION

It is an object of the present invention to provide a reliable horizontal drive circuit for supplying a suitable amount of current to the base of the horizontal output transistor according to the deflection frequency in a video display needing a large current.

According to an embodiment of the present invention, there is provided a high current horizontal drive circuit for a video display, which comprises a horizontal drive means for amplifying the pulses generated by a horizontal oscillator, a drive voltage adjustment means for adjusting a drive voltage, and a horizontal deflection output means for generating a horizontal deflection current according to the adjusted drive voltage.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
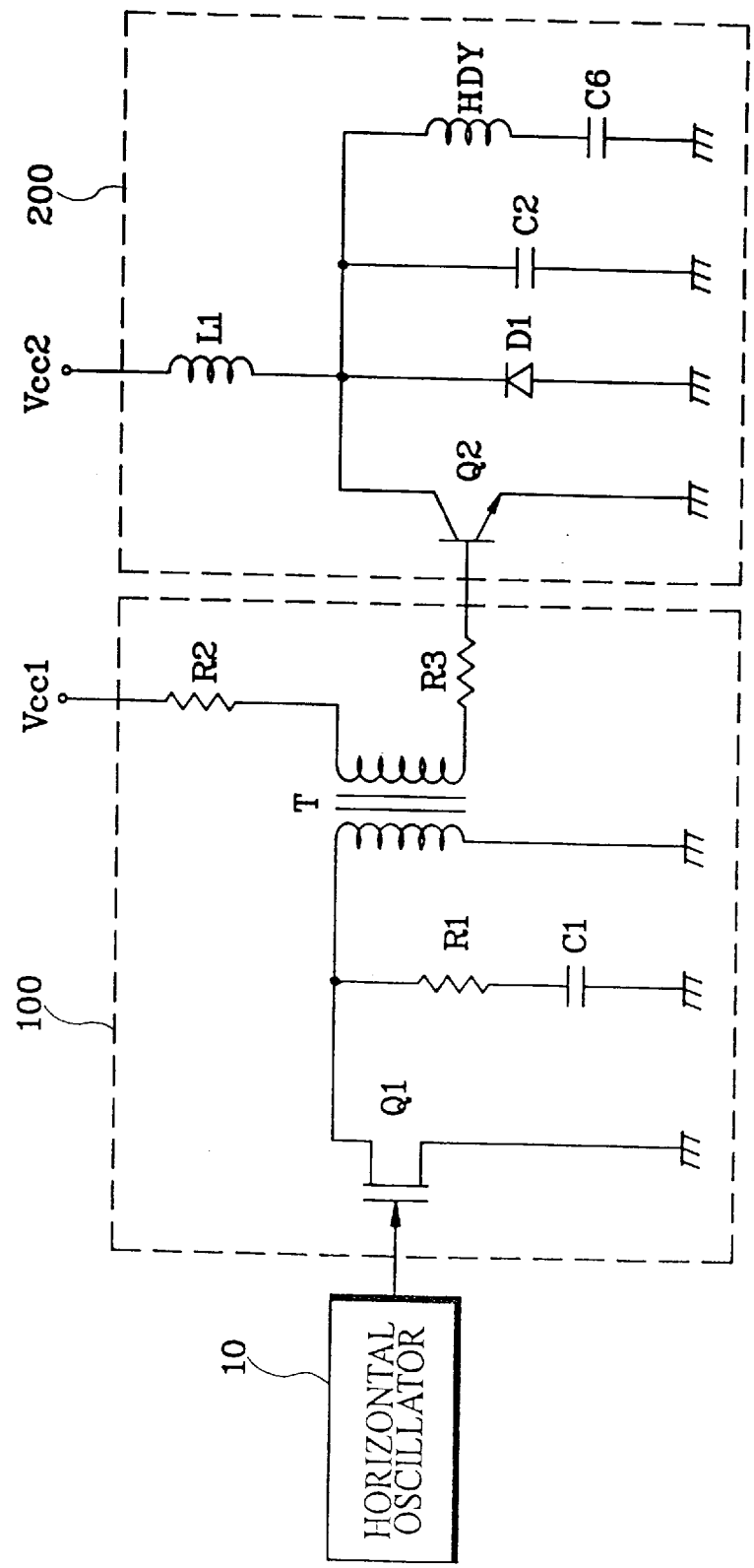
FIG. 1 illustrates an earlier horizontal drive circuit.
Figure 2:
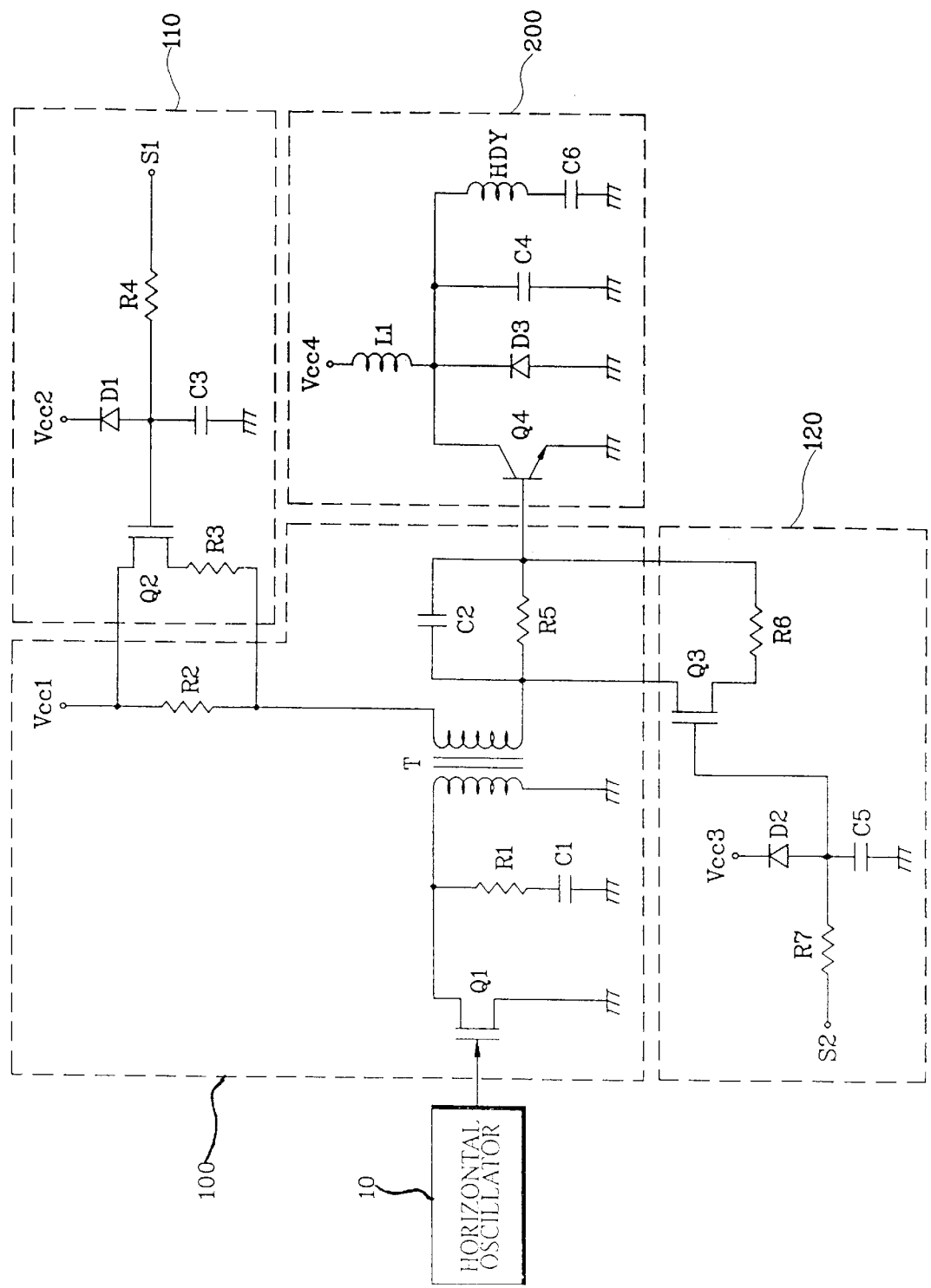
FIG. 2 illustrates a high current horizontal drive circuit according to the present invention.

Referring to FIG. 2, the horizontal oscillator 10 generates pulses amplified by a horizontal drive means 100. A drive voltage adjustment means 110 adjusts a drive voltage supplied by the horizontal drive means so as to meet a high resolution mode. A base voltage adjustment means 120 also adjusts the drive voltage so as to meet a high resolution mode or adjusts the drive voltage adjusted by the drive voltage adjustment means 110. A horizontal deflection output means 200 generates a horizontal deflection current according to the adjusted drive voltage supplied from the drive voltage adjustment means 110 or base voltage adjustment means 120.

The horizontal drive means 100 consists of an FET QI with the base connected to the output of the horizontal oscillator 10; an R-C circuit consisting of a resistor R1 and capacitor C1 for regulating the peak pulse of the switching signal generated by the FET Q1; a resistor R2 for introducing a source voltage Vcc1; a transformer T for inducing the source voltage Vcc1 supplied through the resistor R2 according to the switching signal of the FET Q1 with the peak pulse regulated by the R-C circuit of the resistor R1 and C1, and another R-C circuit consisting of a resistor R5 and capacitor C2 for controlling the pulse generated by the transformer T.

The drive voltage adjustment means 110 for adjusting the drive current of the horizontal deflection output means 200 according to the resolution consists of: a signal source S1 for receiving a high level signal representing the high resolution mode; a first noise absorber consisting of a line noise absorbing resistor R4 and impulse noise absorbing diode D1 and capacitor C3 so as to eliminate the noise accompanying the high level signal; a FET Q2 with the base connected to the noise eliminated high level signal and the drain connected to one end of the resistor R2 of the horizontal drive means 100 for amplifying the source voltage Vcc1, and a bypass resistor R3 with one end connected to the source of the FET Q2 and the other end connected to the other end of the resistor R2.

The base voltage adjustment means 120 for adjusting the drive current of the horizontal deflection output means 200 also consists of: a signal source S2 for receiving a high level signal representing the high resolution mode; a second noise absorber consisting of a line noise absorbing resistor R7 and impulse noise absorbing diode D2 and capacitor C5 so as to eliminate the noise accompanying the high level signal; a FET Q3 with the drain connected to one end of the resistor R5 of the horizontal drive means 100 for amplifying the voltage supplied through the resistor R5 and capacitor C2 from the transformer T, and a bypass resistor R6 with one and connected to the source of the FET Q3 and the other end connected to the other end of the resistor R5.

Thus, the horizontal deflection output means 200 generates a horizontal deflection current by receiving the source voltage Vcc1 adjusted by the drive voltage adjustment means 110 or base voltage adjustment means 120 according the resolution, which consists of: a horizontal output transistor Q4 for performing a switching operation according to the voltage level supplied from the resistor R5 and capacitor C2 of the horizontal drive means 100; capacitors C4 and C6 for performing the charging and discharging operation in response to the switching of the horizontal output transistor Q4; a damping diode D3 for serving as a damper according to the charging and discharging of the horizontal output transistor Q4; noise elimination coil L1 connected to the collector of the horizontal output transistor Q4 to eliminate the alternating current noise generated upon supplying the drive voltage Vcc4. and a horizontal deflector yoke HDY for generating a sawtooth current according to the charging and discharging of the capacitors C4 and C6.

In operation, the horizontal oscillator 10 generates pulses supplied to the base of the FET Q1 of the horizontal drive means 100, so that the FET Q1 carries out the switching operation to generate a switching signal, whose peak pulses are adjusted through the R-C circuit of R1 and capacitor C1. The transformer T induces the source voltage Vcc1 through the resistor R2 according to the switching signal supplied to the primary coil, The output of the transformer is supplied to the base of the horizontal output transistor Q4 of the horizontal output means 200.

The invention constructed as described above operates in the following fashion.

The horizontal oscillator 10 generates a horizontal drive pulse. The horizontal drive pulse is introduced into a FET (Q1), which has a high switching speed and which drives the horizontal drive transformer T.

The voltage source Vcc1 supplies a voltage to the base of the horizontal output transistor Q4 through resistors R2 and R5 and transformer T. The switching of the horizontal output transistor Q4 occurs according to the initial conditions of the drive transformer T. When the switching of the horizontal output transistor Q4 is on-time, the horizontal output transistor Q4 is activated. When off-time, the damping diode D3 (which had been connected to the collector of Q4) is activated, thereby causing the generation of a sawtooth wave.

If the signal sources S1 and S2 (which should receive "high" signals when within a bandwidth range) receive "low" signals, the FET Q2 and the FET Q3 (which are connected to the base circuit of transistor Q4) are turned off and do not activate. Thus, the drive total control resistor R2, the base control resistor R5, and the capacitor C2 are used to supply a current to the base of the transistor Q4.

However, if the above signal sources S1 and S2 receive "high" signals, FET's Q2 and Q3 are activated and turn on. Thus, the support control resistors R3 and R6 are respectively placed in parallel with resistors R2 and R5, thereby increasing the current supplied to the base of the above mentioned horizontal output transistor Q4.

The resistor R1 and the capacitor C1 are used as snubbers for suppressing the pulse peaks. Diodes D1 and D2 and capacitors C3 and C5 are used for suppressing impulse noise. Resistors R4 and R7 are used for suppressing line noise.

Here, in order to control the current received by the base of the above mentioned horizontal output transistor Q4, either the drive voltage control 110 can be used or the base voltage control 120 can be used or both circuits can be used. Even upon using both circuits, the current of the base can be controlled.

Figure 3A:
FIGS. 3A–3D are the various waveforms representing the characteristics of the essential parts of FIG. 2.
Figure 3B:
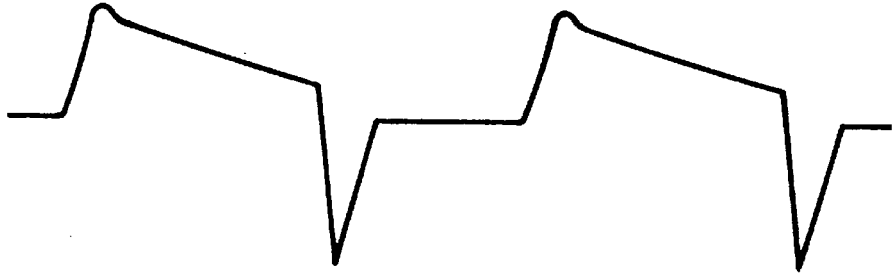
Figure 3C:
Figure 3D:
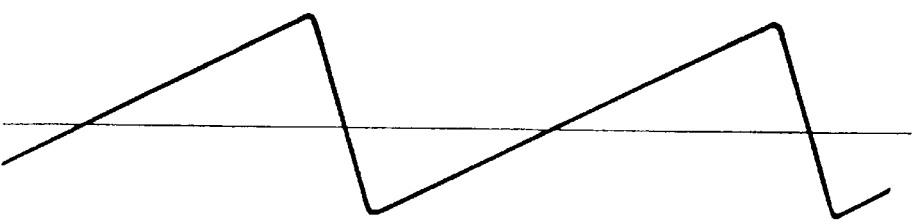

FIGS. 3A–3D are wave diagrams of various locations of the circuit of FIG. 2. FIG. 3A is the voltage wave diagram of the gate of the horizontal drive FET Q1. FIG. 3B is the current wave diagram of the base of the horizontal output transistor Q4. FIG. 3C is the voltage wave diagram of the collector of the horizontal output transistor Q4. FIG. 3D is the current wave diagram of the collector of the horizontal output transistor Q4.

Basically, if the drive energy needed to turn on the horizontal output transistor Q4 is denoted as $W_D$, $W_D = I_{B1} \times V_{BE} \times T_{ON}$.

Here, $I_{B1}$ is the current necessary to completely keep going until the horizontal output transistor Q4 is turned on. $I_{B2}$ is the opposite directional base current used during the turn off of the output transistor. Such a turn off occurs to shorten the $T_{STG}$ (storage time) of the horizontal output transistor Q4.

Thus, within the bandwidth during the use of the display device, maintenance of $I_{B1}$ and $I_{B2}$ greatly affects the drive conditions.

In the above described invention, by using switching of the devices in the base circuit of the horizontal output transistor, its current is controlled. A more effective and more safe application of current and voltage occurs. This can be used in high performance display monitors with horizontal drive circuits which require high speed switching and highly exact timing.

What is claimed is:

1. A high current horizontal drive circuit for a video display, comprising:
   a horizontal drive means for amplifying pulses generated by a horizontal oscillator;
   a drive voltage adjustment means for adjusting a drive voltage; and
   a horizontal deflection output means for generating a horizontal deflection current according to said adjusted drive voltage;

said drive voltage adjustment means comprising a field effect transistor having a drain and source connected across a drive voltage adjustment means resistor, said drive voltage adjustment means resistor being connected to a horizontal transformer of said horizontal drive means, and a first noise absorber connected to gate of said field effect transistor.

2. The horizontal drive circuit as defined in claim 1, said first noise absorber comprising a line noise absorbing resistor connected to an impulse noise absorbing circuit formed of a capacitor and a diode.

3. A high current horizontal drive circuit for a video display comprising:

a horizontal drive means for amplifying pulses generated by a horizontal oscillator;

a base voltage adjustment means for adjusting a drive voltage; and a horizontal deflection output means for generating a horizontal deflection current according to said adjusted drive voltage;

said base voltage adjustment means comprising a field effect transistor for controlling a current supplied to a base of a horizontal output transistor, and a noise absorber connected to a gate of said field effect transistor.

4. The horizontal drive circuit as defined in claim 3, said noise absorber comprising a line noise absorbing resistor connected to an impulse noise absorbing device formed of a capacitor and a diode.

5. A high current horizontal drive circuit for a video display, comprising:

a horizontal drive means for amplifying pulses generated by a horizontal oscillator;

a drive voltage adjustment means for adjusting a drive voltage;

a base voltage adjustment means for adjusting said adjusted drive voltage; and a horizontal deflection output means for generating a horizontal deflection current according to said drive voltage adjusted by said drive voltage adjustment means and base voltage adjustment means.

6. In a horizontal drive circuit for a video display including an output transistor having a base driving circuit including a series combination of first and second resistors and a transformer, the improvement comprising:

a drive voltage adjustment means for selectively connecting a third resistor in parallel with s said first resistor; and a base voltage adjustment means for selectively connecting a fourth resistor in parallel with said second resistor.

7. The apparatus of claim 6, said drive voltage adjustment means comprising a field effect transistor in series with said third resistor for selectively connecting said third resistor in parallel with said first resistor.

8. The apparatus of claim 6, said base voltage adjustment means comprising a field effect transistor in series with said fourth resistor for selectively connecting said fourth resistor in parallel with said second resistor.

9. The apparatus of claim 7, said field effect transistor including a gate electrode having a diode connected to a voltage source and a capacitor connected to ground.

10. The apparatus of claim 8, said field effect transistor including a gate electrode having a diode connected to a voltage source and a capacitor connected to ground.

* * * * *